United States Patent [19]

Campanella et al.

[11] Patent Number: 5,576,933
[45] Date of Patent: Nov. 19, 1996

[54] CLAMPING HEAT SINK FOR AN ELECTRIC DEVICE

[75] Inventors: Vincent Campanella, Wakefield; Osvaldo M. Vasconcelos, Milton, both of Mass.

[73] Assignee: Wakefield Engineering, Inc., Wakefield, Mass.

[21] Appl. No.: 440,753

[22] Filed: May 15, 1995

[51] Int. Cl.$^6$ ........................................... H05K 7/20
[52] U.S. Cl. ..................... 361/704; 24/457; 174/16.3; 248/316.7; 257/727; 361/718
[58] Field of Search ....................... 267/150, 160; 24/295, 457, 458, 625; 248/316.7, 505, 510; 411/352, 516, 522–526; 165/80.3, 185; 174/16.3; 257/706, 707, 723, 724, 727; 361/704, 707, 709, 712, 718, 719, 722

[56] References Cited

U.S. PATENT DOCUMENTS

| | | |
|---|---|---|
| D. 283,418 | 4/1986 | McCarthy . |
| 2,909,354 | 10/1959 | Bingham ................... 248/316.7 |
| 2,916,159 | 12/1959 | O'Neill ......................... 211/89 |
| 3,208,511 | 11/1961 | McAdam . |
| 3,378,736 | 4/1968 | Vale et al. . |
| 3,744,559 | 7/1973 | Overholt . |
| 3,893,161 | 7/1975 | Pesak, Jr. . |
| 4,054,901 | 10/1977 | Edwards et al. . |
| 4,261,005 | 4/1981 | McCarthy ................... 357/81 |
| 4,544,942 | 10/1985 | McCarthy ................... 357/81 |
| 4,552,206 | 11/1985 | Johnson .................... 165/80.3 |
| 4,609,040 | 9/1986 | Moore ...................... 124/16.3 |
| 4,766,653 | 8/1988 | Della Porta ................. 24/563 |
| 5,130,888 | 7/1992 | Moore . |
| 5,225,965 | 7/1993 | Bailey ...................... 361/386 |
| 5,241,453 | 8/1993 | Bright ...................... 361/704 |
| 5,381,041 | 1/1995 | Harmon ..................... 257/718 |

FOREIGN PATENT DOCUMENTS 9105369   4/1991   WIPO .

Primary Examiner—Gerald P. Tolin
Attorney, Agent, or Firm—Blodgett & Blodgett, P.C.

[57] ABSTRACT

A heat sink for frictionally engaging an electronic device. The heat sink includes an enclosure which is formed by a pair of oppositely facing vertically side walls which extend upwardly from a flat horizontal base wall. A pair of opposed resilient clamping fingers extend toward each other and downwardly from the upper ends of the vertical side walls. Each of the clamping fingers has a free rounded end for engaging with a downward biasing force the top surface of an electronic device which is placed within the enclosure of the heat sink. A stop is located on the base wall for locating the electronic device relative to the heat sink. The heat sink also has a protuberance on the inside surface of each vertical side wall for engaging the side walls of the electronic device.

12 Claims, 3 Drawing Sheets

CLAMPING HEAT SINK FOR AN ELECTRIC DEVICE

BACKGROUND OF THE INVENTION

The present invention relates generally to a heat sink which frictionally engages an electronic device such as a semiconductor package for dissipating thermal energy which is generated by the electronic device into the surrounding environment.

Many electronic devices generate heat during their operation. This heat must be dissipated in order to prevent damage to the electronic device. The present invention is specifically directed to an electronic device such as a semiconductor encapsulation package which includes a plastic body with leads extending from one end thereof, and a thermal transfer plate extending from the opposite end of the plastic body. One such semiconductor package is known in the electronic industry as a TO-220 plastic power package. This and similar packages consist of an active semiconductor component which is encapsulated in a plastic body with leads extending from one end of the plastic package and a broad flat thermal transfer plate which is fixed to one major surface of the body and is parallel with the leads.

Typical prior art heat sinks for clamping to electronic devices such as semiconductor packages are stampings of resilient heat conductive and heat dissipating spring metal. The stamping is bent into a structure which has a U-shaped enclosure for receiving and holding a semiconductor package such as a TO-220. The enclosure has a supporting base wall and opposing side walls. The heat sink has an opening to the enclosure and includes resilient fingers or projections for biasing the semiconductor package against the base wall of the heat sink. The heat sink has a hole in the base wall which is to be aligned with a similar hole in the semiconductor package. The heat sink is provided with a stop for locating the semiconductor package within the enclosure of the heat sink that the holes of both bodies are aligned. The sides of the semiconductor package is restrained by the side walls of the heat sink. Since the heat walls of the heat sink are formed by bending, the inside corner of each side wall where it joins the base wall is rounded. If the heat sink enclosure is dimensioned so that the distance between the side walls is equal to the width of the semiconductor package, the semiconductor package is prevented from attaining a flush contact with the base wall because of the rounded inside corners of the enclosure. If the side walls are bent so that the distance between the side walls is greater than the width of the semiconductor package, the semiconductor package will be flush with the base wall. However, this results in an unacceptable sloppy lateral fit of the semiconductor package within the heat sink enclosure.

Another problem which is frequently encountered with clamping heat sinks is the difficulty of inserting an electronic device such as a semiconductor package into and/or out of the enclosure of the heat sink. These and other difficulties encountered with prior art heat sinks are obviated by the present inventions.

It is a primary object of the present invention to provide a clamping heat sink for an electronic device such as a semiconductor package which clamps the electronic device firmly and securely.

Another object of the invention is the provision of a clamping heat sink for an electronic device which is easily applied to the electronic device and which can be easily removed from the electronic device.

A further object of the invention to provide a variant clamping heat sink for an electronic device which is capable of holding a pair of electronic devices.

With these and other objects in view, as will be apparent to those skilled in the art, the invention resides in the combination of parts set forth in the specification and covered by the claims appended hereto.

SUMMARY OF THE INVENTION

The invention consists of a heat sink for frictionally engaging and holding an electronic device. The heat sink includes a pair of oppositely facing vertically side walls which extend upwardly from a flat horizontal base wall. A pair of opposed resilient clamping fingers extend toward each other and downwardly from the upper ends of the vertical side walls. Each of the clamping fingers has a rounded free end for engaging the top surface of an electronic device which is inserted into the heat sink. A stop is located on the base wall for locating the electronic device relative to the heat sink. More specifically, the heat sink has a protuberance on the inside surface of each vertical side wall for engaging the side walls of the electronic device.

BRIEF DESCRIPTION OF THE DRAWINGS

The character of the invention, however, may be best understood by reference to one of its structural forms, as illustrated by the accompanying drawings, in which.

DESCRIPTION OF THE PREFERRED EMBODIMENT

Figure 1:
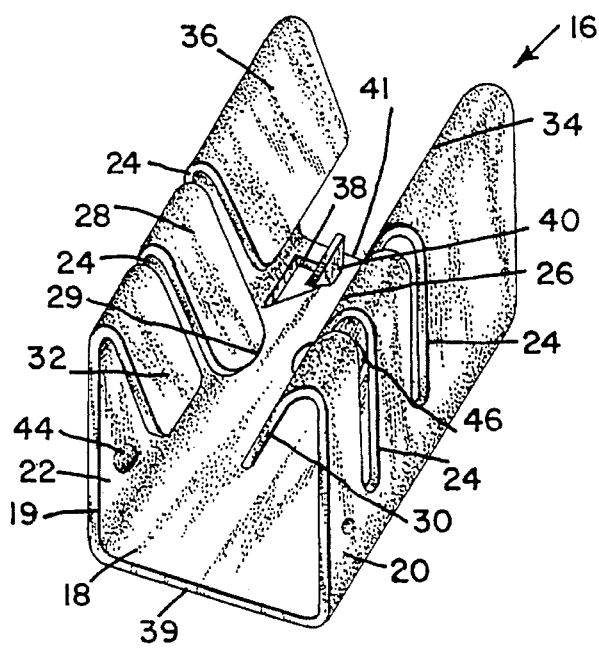
FIG. 1 is an isometric view looking from the front left corner of a heat sink embodying the principles of the present invention.
Figure 2:
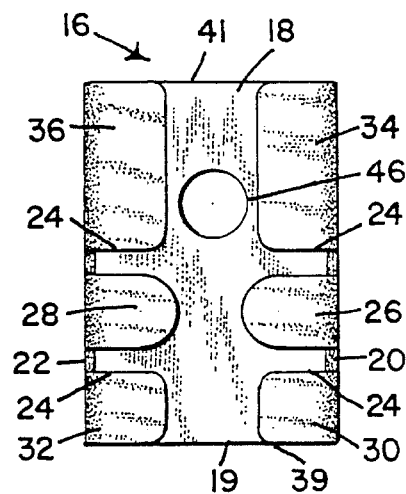
FIG. 2 is a top plan view of the heat sink.
Figure 5:
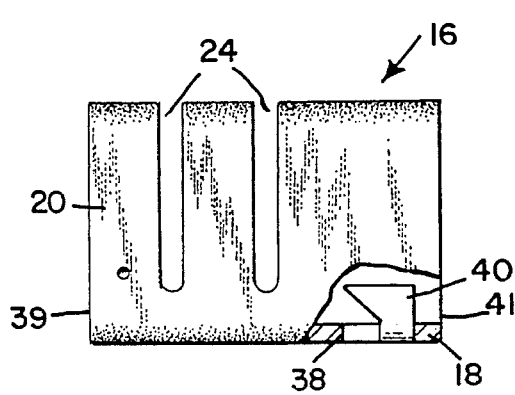
FIG. 5 is a left hand elevational view of the heat sink.
Figure 3:
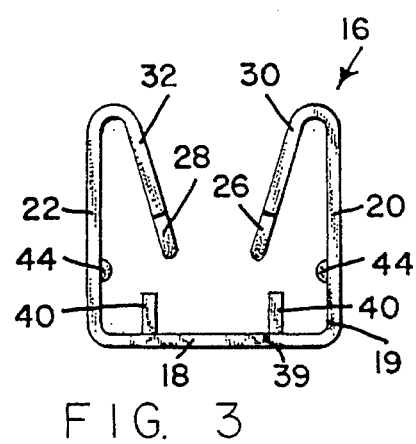
FIG. 3 is a front elevational view of the heat sink.
Figure 6:
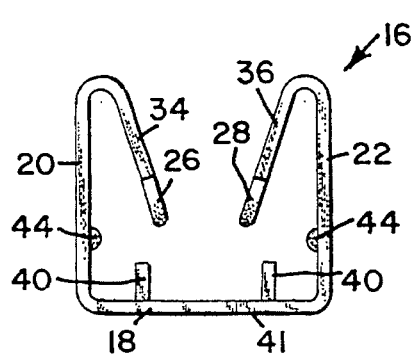
FIG. 6 is a rear elevational view of the heat sink.
Figure 4:
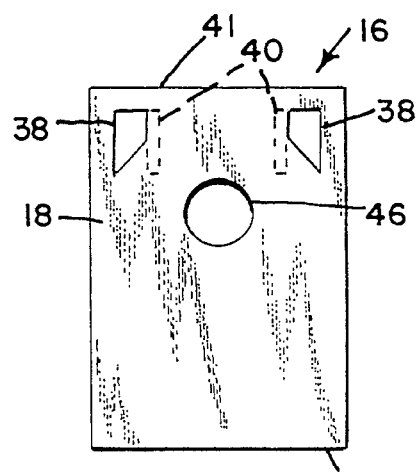
FIG. 4 is a bottom plan view of the heat sink.

Referring first to FIGS. 1–6, the heat sink of the present invention is generally indicated by the reference numeral 16. The heat sink 16 is made from a spring metal stamping which is formed into the U-shaped configuration shown in the drawings. The heat sink 16 includes a flat horizontal base 18 and a pair of opposed vertical side walls 20 and 22 which extend upwardly from the base 18. The upper portions of the vertical walls 20 and 22 are bent toward one another so that the upper end of each vertical wall is rounded and the remaining free end portions of the stamping extend toward one another and downwardly toward the base 18. Each vertical wall 20 and 22 has vertical slots 24 which extend upwardly from a point which is spaced from the base 18 to the rounded top of the vertical side wall and to the free ends of the stamping. The slots 24 divide the free ends of the stamping into a plurality of opposed fingers. These opposed fingers include a pair of opposed resilient clamping fingers 26 and 28 which are connected to the vertical side walls 20 and 22, respectively. The free end of each of the clamping fingers has a rounded end 29. The end 29 is rounded within a plane which is parallel with the plane of the clamping finger and which extends longitudinally of the heat sink. The remaining opposed fingers, identified by the reference numerals 30, 32, 34, and 36, function as heat dissipating fingers. The rounded end 29 of each of the clamping fingers 26 and 28 extends substantially below the ends of the heat dissipating fingers 30, 32, 34, and 36. The base 18 has a front end edge 39 and a rear end edge 41. The base 18 has a pair of triangular shape cuts 38 adjacent the rear end edge 41. The material within in each of the cuts 38 is bent upwardly 90° to the base 18 to form a pair of forwardly facing projections or stops 40. The forwardly facing side of each projection 40 is at an acute angle to the base. The inner surface of each of the side walls 20 and 22 has protuberances 44. The protuberances 44 face one another.

Figure 7:
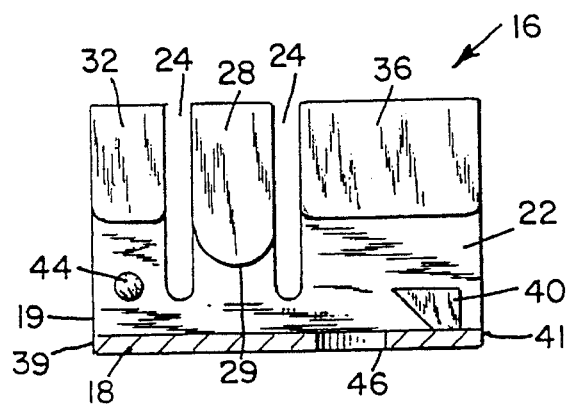
FIG. 7 is a vertical cross-sectional view of the heat sink taken along the line VII—VII of FIG. 2.
Figure 8:
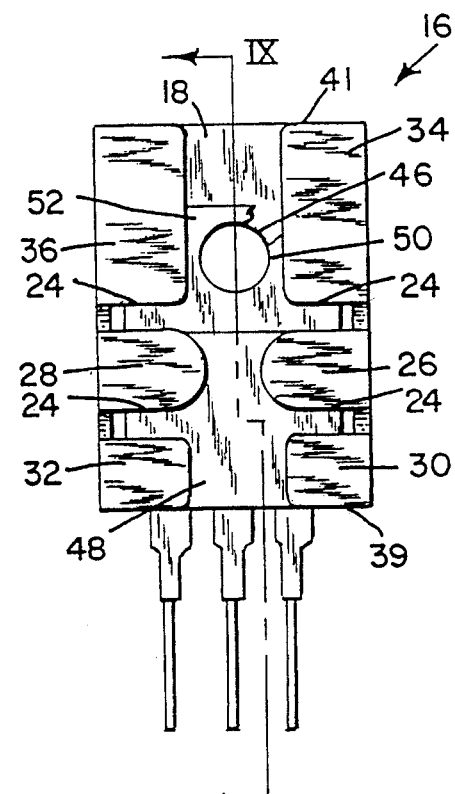
FIG. 8 is a top plan view of the heat sink showing the heat sink in clamping position on an electronic device.
Figure 9:
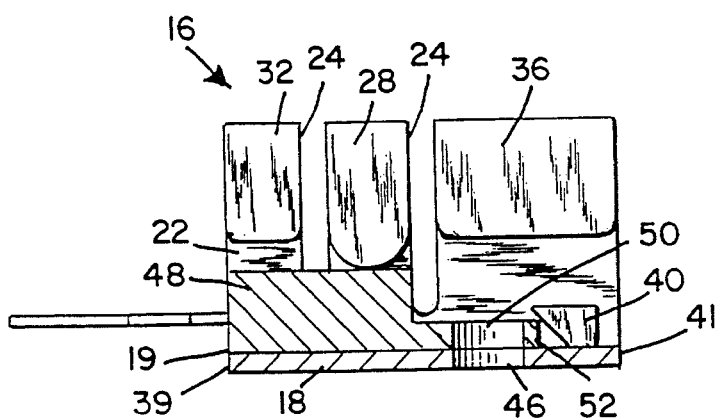
FIG. 9 is a vertical cross-sectional view of the heat sink and an electronic device to which the heat sink is applied, taken along the line IX—IX of FIG. 8.
Figure 10:
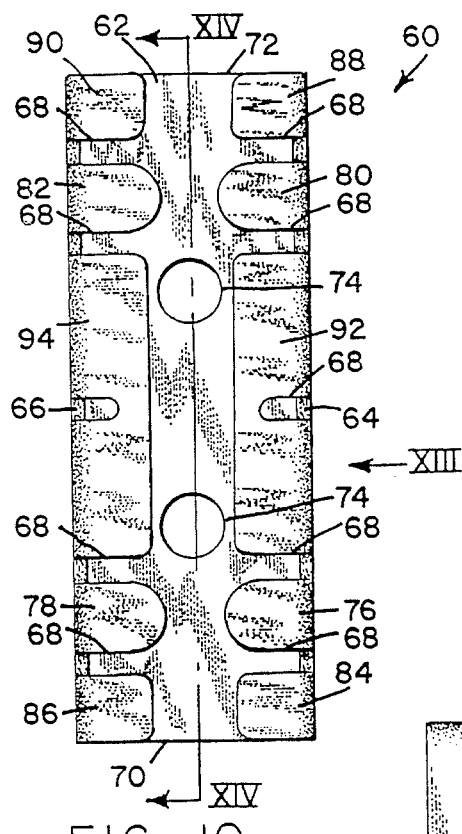
FIG. 10 is a top plan view of modified heat sink which is designed for receiving a pair of identical electronic devices.
Figure 12:
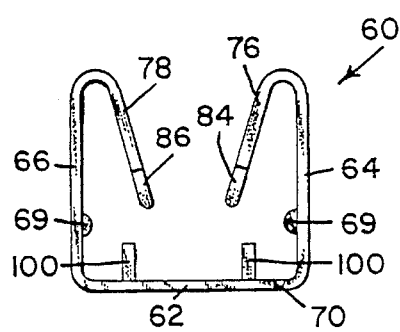
FIG. 12 is front elevational view of the modified heat sink.
Figure 13:
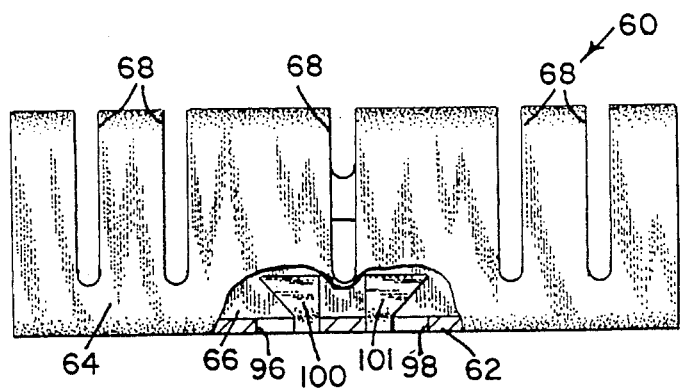
FIG. 13 is a side elevational view of the modified heat sink, looking in the direction of arrow XII in FIG. 10.
Figure 11:
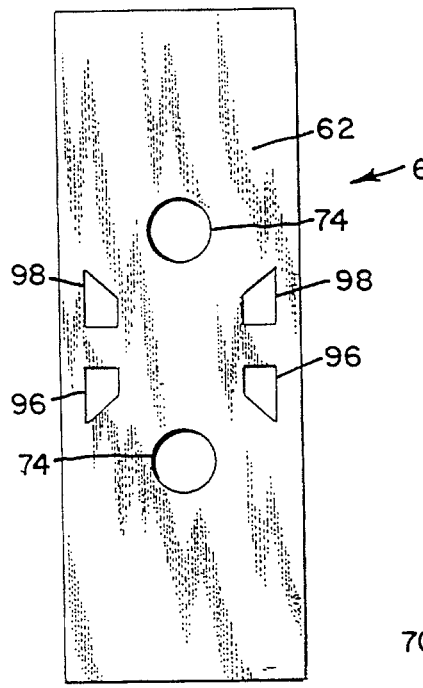
FIG. 11 is a bottom plan view of the modified heat sink of FIG. 10.
Figure 14:
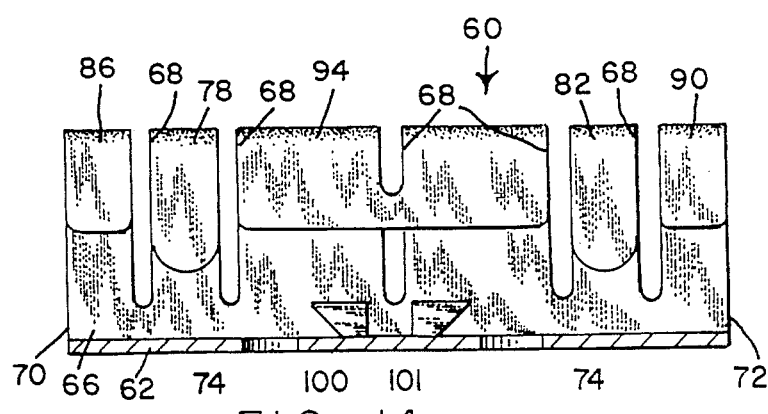
FIG. 14 is a vertical cross-sectional view of the modified heat sink taken along the line XIV—XIV of FIG. 10 and looking in the direction of the arrows.

Referring to FIGS. 7–9, the heat sink 16 of the present invention is applied to an electronic device such as a TO-220 semiconductor package by inserting the electronic device, indicated by the reference numeral 48, into the enclosure which is formed by the base 18 and the vertical side walls 20 and 22 through the front opening 19. The width of the electronic device is less than the distance between the opposed and the surfaces of the vertical side walls 20 and 22 and is substantially equal to the distance between the protuberances 44. When the electronic device 48 is inserted through the front opening 19, the bottom surface of the electronic device 48 engages the upper surface of the base 18 and the side surfaces of the electronic device engage the protuberances 44. As the electronic device 48 is moved rearwardly into the enclosure of the heat sink 16, the top surface of the electronic device engages the rounded lower edges of the clamping fingers 26 and 28 and deflects the clamping fingers 26 and 28 upwardly. Since the clamping fingers are resilient, they apply a biasing downward force on the electronic device, thereby effectively clamping the electronic device between the clamping fingers 26 and 28 and the base 18. The electronic device 48 includes a relatively thin rear portion 52 which contains a circular aperture 50. As the electronic device 48 is moved rearwardly within the heat sink 16, the relatively thin portion 52 of the electronic device engages the forwardly facing edges of the projections 40. This effectively locates the electronic device 48 within the heat sink 16 so that the aperture 50 of the electronic device is vertically aligned with the aperture 46 of the base 18.

MODIFIED HEAT SINK

Referring to FIGS. 10–13, there is shown a modified heat sink which is generally indicated by the reference numeral 60. Heat sink 60 is a duplex version of the heat sinks 16 for receiving and holding two electronic devices such as the electronic device 48. The heat sink 60 is approximately twice as long as the heat sink 16 and is equivalent to two heat sinks 16 connected end to end at their back ends.

The heat sink 60 is formed from a stamping of spring metal into a generally U-shaped configuration having a horizontal base wall 62 and a pair of vertical side walls 64 and 66 which extend upwardly from the base wall 62. Each of the vertical side walls 64 and 66 has a plurality of vertical slots 68 which define a plurality of fingers at the upper free ends of the vertical walls. The base and side walls of the heat sink form an enclosure which has a front opening 70 and a rear opening 72. The base wall 62 has a pair of spaced circular apertures 74. A pair of resilient clamping fingers 76 and 78 are located adjacent the front opening 70 and a pair of resilient clamping fingers 80 and 82 are located adjacent the rear opening 72. The clamping fingers 76 and 78 extend from the tops of the vertical side walls 64 and 66, respectively, toward each other and downwardly toward the base wall 62. The clamping fingers 80 and 82 extend from the upper portion of the side walls 64 and 66 toward each other and downwardly toward the base wall 62. Each pair of opposed clamping fingers are identical to the clamping fingers 26 and 28 of the heat sink 16 in both structure and function. A plurality of inwardly and downwardly facing heat dissipation fingers 84, 86, 88, 90, 92, and 94 extend from the upper ends of the side walls 64 and 66. The base wall 62 has a pair of triangular shaped cuts 96 and a pair of triangular shaped cuts 101. The material within each of the cuts 96 is bent upwardly at a 90° angle to the base to form projections or stops 100. The edge surface of each projection 100 which faces toward the front opening 70 is at an acute angle to the base. The material within each cut 98 is bent upwardly to form a pair of projections or stops 101. The edge surface of each projection 101 which faces toward the rear opening 72 is at an acute angle to the base. The projections 100 and 101 function in the same manner as the projections 40 in the heat sink 16 for locating an electronic device which is inserted into the heat sink.

During operation of the heat sink 60, a first electronic device is inserted into the enclosure which is formed by the heat sink through the front opening 70 so that the top surface of the electronic device is engaged by the lower rounded ends of the clamping fingers 76 and 78 the biases the electronic device toward the base wall 62. The first electronic device is moved inwardly until the rear end of the first electronic device engages the stops 100 to properly locate the first electronic device within the heat sink enclosure. A second electronic device is inserted within the heat sink enclosure through the rear opening 72 so that the top surface of the second electronic device is engaged by the lower rounded ends of the clamping fingers 80 and 82 and the rear end of the second electronic device engages the projections 101 to properly locate the second electronic device within the heat sink enclosure.

Clearly, minor changes may be made in the form and construction of the invention without departing from the material spirit thereof. It is not, however, desired to confine the invention to the exact forms shown herein and described but it is desired to include all subject matter that properly comes within the scope claimed.

The invention having been thus described, what is claimed as new and desired to secure by Letters Patent is:

1. A heat sink frictionally engaging a solid state electronic device, said electronic device having a top surface, said heat sink comprising:

(a) a flat horizontal base having a front end and a rear end;

(b) a pair of oppositely facing vertical side walls directly connected to the base and extending upwardly front the base, each of said vertical side walls having a top end, said side walls and said base forming an enclosure containing a solid state electronic device and a front opening to said enclosure at said front end receiving the electronic device;

(c) a pair of opposed resiliently deflectable fingers directly attached to the vertical side walls and extending downwardly into said enclosure from the top ends of said vertical side walls, each of said fingers lying in a respective front-to-back plane which is at an acute angle to said vertical side walls, each of said fingers having a front edge, a back edge and a rounded free end edge which extends from said front edge to said back edge within the front-to-back plane of the finger, engaging the top surface of the solid state electronic device which is inserted into said enclosure through said front opening, said fingers being deflected upwardly by the solid state electronic device which is inserted into said enclosure so that said fingers exert a downward biasing force on said electronic device for clamping said solid state electronic device between said fingers and said base; and (d) a stop which extends upwardly from said base at a point which is spaced from said front opening thereby positioning said solid state electronic device within said enclosure.

2. A heat sink as recited in claim 1, wherein there are a plurality of heat dissipation fingers extending downwardly from the top end of each of said vertical side walls toward said base, each of said heat dissipating fingers terminating in a free end which is above the level of the free ends of said resilient fingers.

3. A heat sink as recited in claim 1, wherein said stop is a projection which is formed from said base and which extends at an acute angle to the base toward the front end of the base.

4. A heat sink as recited in claim 3, wherein there are two projections which are spaced from one another.

5. A heat sink as recited in claim 1, wherein said heat sink further comprises a pair of oppositely facing protuberances on the oppositely facing sides of said vertical side walls engaging the opposite sides of the solid state electronic device.

6. A heat sink as recited in claim 1, wherein each of said vertical side walls has a plurality of vertical slots.

7. A heat sink as recited in claim 1, wherein said heat sink is a duplex unit frictionally engaging a pair of electronic devices, wherein said pair of opposed resiliently deflectable fingers is a first pair of opposed resiliently deflectable fingers, said stop is a first stop, and said housing has a second pair of opposed resilient fingers which is identical to said first pair of opposed resilient fingers, a rear opening at said rear end and a second stop which is identical to said first stop and spaced from said rear opening.

8. A heat sink frictionally engaging a solid state electronic device which has a top surface, a bottom surface, and a pair of opposite side surfaces, said heat sink comprising:

(a) a flat horizontal base having a front end, a rear end and a top surface;

(b) a pair of oppositely facing vertical side walls directly connected to the base and extending upwardly from the base, said side walls and said base forming an enclosure contains said solid state electronic device and a front opening to said enclosure at said front end receiving the solid state electronic device into said enclosure;

(c) a pair of opposed resiliently deflectable fingers directly attached to the vertical side walls and extending downwardly from the top ends of said vertical side walls toward said base, each of said fingers having a free end engaging the top surface of the solid state electronic device which is inserted into said enclosure through said front opening said resilient fingers being deflectable upwardly by the insertion of the solid state electronic device into said enclosure so that said resilient fingers exert a downward biasing force on the electronic device for clamping the solid state electronic device between said fingers and said base;

(d) a pair of oppositely facing protuberances on the oppositely facing sides of said vertical side walls engaging the opposite side walls of the solid state electronic device which is inserted into said enclosure; and (e) a stop which extends upwardly from said base adjacent the rear end of said base thereby positioning said solid state device within said enclosure.

9. A heat sink frictionally engaging a solid state electronic device which has a top surface, a bottom surface, and a pair of opposite side surfaces, said heat sink being a stamped metal body comprising:

(a) a flat horizontal base having a front end, a rear end and a top surface;

(b) a pair of oppositely facing vertical side walls directly connected to the base and extending upwardly from the base, each of said vertical side walls having a top end and a plurality of vertical slots, each of said side walls having an inside surface which forms a rounded inside corner with the top surface of said base, said side walls and said base forming an enclosure containing the solid state electronic device and an opening to said enclosure at said front end receiving the electronic device;

(c) a pair of opposed resiliently deflectable fingers directly attached to the vertical side walls and extending downwardly from the top ends of said vertical side walls toward said base, each of said fingers having a free end engaging the top surface of the solid state electronic device which is inserted into said enclosure through said opening, said fingers being deflected upwardly by the insertion of the solid state electronic device into said enclosure so that said fingers exert a downward biasing force on said top surface of the electronic device;

(d) a pair of oppositely facing protuberances on the inside surfaces of said vertical side walls engaging the opposite side surfaces of a solid state electronic device which is inserted through said opening, said protuberances extending inwardly from said inside surfaces, at least as far inwardly as said inside corners to insure that the bottom surface of the solid state electronic device which is inserted into said enclosure does not engage said inside corners and engages the top surface of said base; and (e) a stop which extends upwardly from said base adjacent the rear end of said base thereby positioning said solid state electronic device within said enclosure.

10. A heat sink as recited in claim 9, wherein each of said vertical side walls has a plurality of vertical slots.

11. A heat sink frictionally engaging a pair of solid state electronic devices, each of said solid state electronic devices having a top surface, said heat sink comprising:

(a) a flat horizontal base having a front end and a rear end;

(b) a pair of oppositely facing vertical side walls directly connected to the base extending upwardly from the base, each of said vertical side walls having a top end, said side walls and said base forming an enclosure containing the pair of solid state electronic devices, a front opening to said enclosure at said front end receiving a first solid state electronic device and a rear opening to said enclosure at said back end receiving a second solid state electronic device;

(c) a first pair of opposed resiliently deflectable fingers directly attached to the vertical side walls and extending from the top ends of said vertical side walls adjacent said front opening, each of said fingers lying in a front-to-back plane which is at an acute angle to said vertical side walls, each of said fingers having a front edge, a back edge and a rounded free end edge which extends from said front edge to said back edge within the front-to-back plane of said finger engaging the top surface of the first solid state electronic device which is inserted into said front opening, said first fingers being deflected upwardly by the insertion of the first solid state electronic device into said enclosure so that said first fingers exert a downward biasing force on the first solid state electronic device;

(d) a second pair of opposed resiliently deflectable fingers directly attached to the vertical side walls and extending from the top ends of said vertical side walls adjacent said back opening, each of said second pair of opposed resiliently deflectable fingers being identical to said first pair of resiliently deflectable fingers and engaging the top surface of the solid state electronic device which is inserted into said rear opening, said second pair of resiliently deflectable fingers being deflected upwardly by the insertion of the second solid state electronic device into said enclosure so that said second pair of fingers exert a downward biasing force on the top surface of the second solid state electronic device; and (e) stop means which extends upwardly from said base between the front and back ends of said base thereby positioning the first electronic device which is inserted into said front opening and the second electronic device is inserted into said back opening and is accurately positioned within said enclosure.

12. A heat sink frictionally engaging a pair of solid state electronic devices each of said solid state electronic devices having a top surface, a bottom surface, and a pair of opposite side surfaces, said heat sink comprising:

(a) a flat horizontal base having a front end and a back end and a top surface;

(b) a pair of oppositely facing vertical side walls directly connected to the base and extending upwardly from the base, each of said vertical side walls having a top end, said side walls and said base forming an enclosure contains the pair of electronic devices, a front opening to said enclosure at said front end receiving a first solid state electronic device and a rear opening to said enclosure at said rear end receiving a second solid state electronic device;

(c) a first pair of opposed resiliently deflectable fingers directly attached to the vertical side walls and extending downwardly from the top ends of said vertical side walls toward said base adjacent said front opening, each of said fingers having a free end engaging the top surface of the first solid state electronic device which is inserted into said enclosure through said front opening said first resilient fingers being deflected upwardly by the insertion of the first solid state electronic device into said enclosure so that said first resilient fingers exert a downward biasing force on the top surface of the first solid state electronic device;

(d) a second pair of opposed resiliently deflectable fingers directly attached to the vertical side walls and extending downwardly from the top ends of said vertical side walls toward said base adjacent said back opening, each finger of said second pair of fingers having a free end engaging the top surface of the second solid state electronic device which is inserted into said enclosure through said back opening, said second pair of fingers being deflected upwardly by the insertion of the second solid state electronic device into said enclosure so that said second pair of fingers exert a downward biasing force on the top surface of the second electronic device;

(e) a first pair of oppositely facing protuberances on the oppositely facing sides of said vertical side walls adjacent said front opening engaging the opposite side surfaces of the first solid state electronic device which is inserted into said front opening;

(f) a second pair of oppositely facing protuberances on the oppositely facing sides of said vertical side walls adjacent said back opening engaging the opposite side surfaces of the second solid state electronic device which is inserted into said rear opening; and (g) stop means which extends upwardly from said base between the front and back ends of said base thereby positioning the first electronic device which is inserted into said front opening and a second electronic device which is inserted into said rear opening and is accurately positioned within said enclosure.

* * * * *